US006632737B1

(12) United States Patent
Hillman et al.

(10) Patent No.: US 6,632,737 B1
(45) Date of Patent: Oct. 14, 2003

(54) METHOD FOR ENHANCING THE ADHESION OF A BARRIER LAYER TO A DIELECTRIC

(75) Inventors: Joseph T. Hillman, Scottsdale, AZ (US); Tugrul Yasar, Scottsdale, AZ (US); Richard C. Westhoff, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 369 days.

(21) Appl. No.: 09/687,324

(22) Filed: Oct. 13, 2000

(51) Int. Cl.$^7$ ............................................... H01L 21/76
(52) U.S. Cl. ........................................................ 438/654
(58) Field of Search .................................. 438/767, 680, 438/653, 654, 628, 627, 684, 685, 643, 644, 687

(56) References Cited

U.S. PATENT DOCUMENTS

| | | | | |
|---|---|---|---|---|
| 4,608,271 A | * | 8/1986 | Hieber et al. .................. 427/38 |
| 4,957,777 A | * | 9/1990 | Ilderem et al. ............ 427/255.2 |
| 5,175,017 A | * | 12/1992 | Kobayashi et al. ............. 427/8 |
| 5,895,261 A | * | 4/1999 | Schinella et al. ............ 438/586 |
| 5,919,531 A | * | 7/1999 | Arkles et al. ................ 427/576 |
| 6,491,978 B1 | * | 12/2002 | Kalyanam ............ 427/255.394 |
| 6,503,375 B1 | * | 1/2003 | Maydan et al. .............. 204/242 |

* cited by examiner

Primary Examiner—Matthew Smith
Assistant Examiner—Calvin Lee
(74) Attorney, Agent, or Firm—Wood, Herron & Evans, LLP

(57) ABSTRACT

A method for chemical vapor deposition comprises providing a thin layer of silicon on the surface of a dielectric-covered substrate prior to depositing a tantalum-based barrier layer from a mixture of a vapor-phase reactant comprising a tantalum halide and a reducing gas. The thin layer of silicon serves to significantly reduce the accumulation of halogen atoms at the interface between the tantalum-based layer and dielectric. The thin layer of silicon may be substantially removed from the surface of the dielectric during the chemical vapor deposition. The method advantageously promotes the adhesion of the tantalum-based layer to the dielectric by reducing the halogen content at the tantalum/dielectric interface.

86 Claims, 4 Drawing Sheets

METHOD FOR ENHANCING THE ADHESION OF A BARRIER LAYER TO A DIELECTRIC

FIELD OF THE INVENTION

The present invention relates to chemical vapor deposition, integrated circuit fabrication and, in particular, to methods for depositing metal layers on a dielectric substrate.

BACKGROUND OF THE INVENTION

Integrated circuits are fabricated by multiple processing steps which reproduce an array of identical electrically active devices and dielectric isolation regions on a semiconductor substrate or wafer. Active devices are electrically connected by contact structures that include multi-leveled metallization of conduction paths or interconnect lines. The multi-level metallization is formed by sequentially depositing layers of materials including an electrical conductor on a substrate, forming a patterned layer on the deposited layers, and etching the unprotected portions of the deposited layers to form the interconnect lines. The interconnect lines are electrically isolated by depositing an overlayer of an electrical insulator, such as a silicon oxide.

Copper is rapidly supplanting aluminum in the fabrication of interconnect lines because the use of copper enhances device performance and density at a reduced cost. The primary advantage of copper over aluminum is its significantly lower electrical resistivity. Because less power is dissipated by a material having a higher conductivity, integrated circuits having copper interconnect lines can operate at a significantly reduced power level. Further, the lower resistivity of copper reduces the delay in signal propagation associated with resistance capacitance (R—C) effects. The higher electrical conductivity of copper also reduces the required number of interconnect levels, which eliminates a significant number of process steps and improves device yield. Finally, copper is less prone to the electromigration and stress migration that afflict interconnect lines of aluminum-based metallization. For all these reasons, multi-level interconnect lines of copper are now preferred in the fabrication of integrated circuits.

Despite these apparent advantageous material properties, copper-based interconnect lines have certain shortcomings, including but not limited to the significant diffusivity of copper in commonly-used dielectrics, such as silicon oxide. The presence of copper can cause the dielectric to become conductive and decrease the associated dielectric strength. Further, copper can diffuse through the dielectric layer to reach electrically active regions in the semiconductor substrate, such as a silicon substrate. Copper is known to be highly reactive with and a fast diffuser in silicon, in which copper acts as an impurity species to produce deep electron trap levels that negatively impact device performance and yield.

One known method of preventing copper diffusion into the dielectric and substrate is to position a barrier layer at the interface between the layers of copper and dielectric. For example, a barrier layer of a tantalum-based metal, such as tantalum (Ta) or tantalum nitride (TaN$_x$), is commonly deposited to create a diffusion barrier between an interconnect layer of copper and an underlying dielectric, such as silicon oxide.

Various deposition and growth techniques exist for forming the tantalum-based diffusion barrier. For example, the barrier layer of tantalum or tantalum nitride can be deposited by a physical vapor deposition (PVD) technique, such as by sputtering. However, the resulting surface coverage is inadequate and non-uniform, particularly for surface features having a high aspect ratio, such as vias, contact holes, and trenches. Since sputtered material moves in line-of-sight paths to a substrate, a layer deposited by sputter deposition can not conform to the surface topography. Layers deposited by PVD have a thickness contingent upon the angle of exposure to the incident flux of deposition material so that the bottoms and sidewalls of high aspect ratio features are not effectively covered.

Chemical vapor deposition (CVD) processes, such as thermal CVD and plasma enhanced CVD (PECVD), provide deposition methods for tantalum-based materials that have important advantages over PVD. In particular, chemical deposition processes can synthesize a layer with significantly improved conformality so that the bottoms and sidewalls of high aspect ratio features are covered by nearly equivalent thicknesses of layer material.

Thermal CVD is a high temperature process in which gaseous reactants, which may contain a halogen-based vapor phase reactant, are passed over a heated substrate. The gaseous reactants readily decompose in the high temperature environment of the reactor and recombine to form a solid layer on the heated substrate. Plasma-enhanced CVD introduces a plasma to produce reactive chemical species from the gaseous reactants, which combine to deposit the desired layer on the surface of the substrate. The plasma enhancement provided by plasma-enhanced chemical vapor deposition allows layers to be deposited at a significantly lower temperature than those deposited by unassisted thermal chemical vapor deposition methods.

A tantalum-based material can be formed by a chemical vapor deposition process that exposes a heated surface of a substrate to a vapor-phase reactant of a tantalum halide, such as tantalum pentafluoride (TaF$_5$), and a reducing gas, such as hydrogen (H$_2$) or ammonia (NH3). Tantalum metal is deposited if hydrogen is used as the reducing gas, and tantalum nitride metal is deposited if ammonia or other nitrogen-containing gas is used as the reducing gas. Layers deposited by chemical vapor deposition processes incorporate, as an impurity, a low level of residual halogen atoms that originate as a by-product from the reduction of the metal halide vapor-phase reactant.

One drawback associated with the chemical vapor deposition of the tantalum-based layer on the dielectric is the presence of an enhanced concentration of residual halogen atoms at the interface between the dielectric and the metal layer. Particularly, the interfacial halogen has been found to correlate with reduced adhesion of the tantalum-based metal layer to the underlying dielectric. As a result, delamination of the metal layer is substantially more likely to occur. FIG. 1 is a secondary ion mass spectroscopy (SIMS) depth profile that shows the high level of fluorine trapped at the metal/dielectric interface following a deposition of a 20 nm layer of tantalum by PECVD on silicon oxide. The level of trapped fluorine can approach 5 atomic percent.

There is thus a need for a deposition method that will prevent extraneous halogen atoms from accumulating at the interface between a tantalum-based layer, deposited by a chemical vapor deposition process, and an underlying dielectric and that can do so without significantly altering the properties of a copper layer subsequently deposited over the tantalum-based layer.

SUMMARY OF THE INVENTION

The present invention provides a method of depositing a tantalum-based layer onto a dielectric-covered portion of a semiconductor substrate, wherein the layer has an enhanced adhesion to the dielectric. To this end, and in accordance with the principles of the present invention, a thin layer of silicon having a predetermined thickness of between about 1 nm and about 10 nm is formed on the dielectric before forming a superjacent layer of a tantalum-based material by chemical vapor deposition (CVD). By way of example, the tantalum-based layer may comprise either tantalum or tantalum nitride formed by any CVD method, such as either plasma-enhanced CVD or thermal CVD, utilizing a vapor-phase reactant of a tantalum halide, such as tantalum pentafluoride. The silicon layer prevents significant accumulation of by-product halogen atoms at the interface between the tantalum-based metal layer and the dielectric material. As a result, the silicon layer enhances the adhesion between the tantalum-based metal layer and the underlying dielectric that has been correlated with the absence of a significant concentration of halogen atoms at the metal/dielectric interface.

In one embodiment, the layer of silicon is a sacrificial layer that may be substantially removed from the surface of the dielectric during the CVD of the tantalum-based metal layer. As a result, the properties of the metal/dielectric interface are unaffected by the intervening silicon layer because it is no longer present.

The present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

According to the present invention, a thin layer of silicon is deposited on a dielectric covered semiconductor substrate prior to the chemical vapor deposition (CVD), for example thermal CVD or plasma-enhanced CVD, of a layer of a tantalum-based metal, such as tantalum or tantalum nitride. The thin layer of silicon prevents halide atoms from accumulating at the interface between the metal thin layer and the dielectric. As a result, the tantalum-based metal layer has a significantly improved adhesion to the dielectric. As the metal layer is deposited, the thin layer of silicon may be a sacrificial layer that is substantially removed from the underlying dielectric so that the electrical properties of the metal/dielectric interface will remain substantially unaltered.

In one embodiment of the present invention, the silicon layer and the metal layer are deposited on the dielectric-covered portion of the semiconductor substrate using plasma-enhanced CVD. However, it may be understood that the present invention may be employed for the deposition of a metal layer using an alternative CVD process, such as thermal CVD, without departing from the spirit and scope of the present invention.

Figure 2:
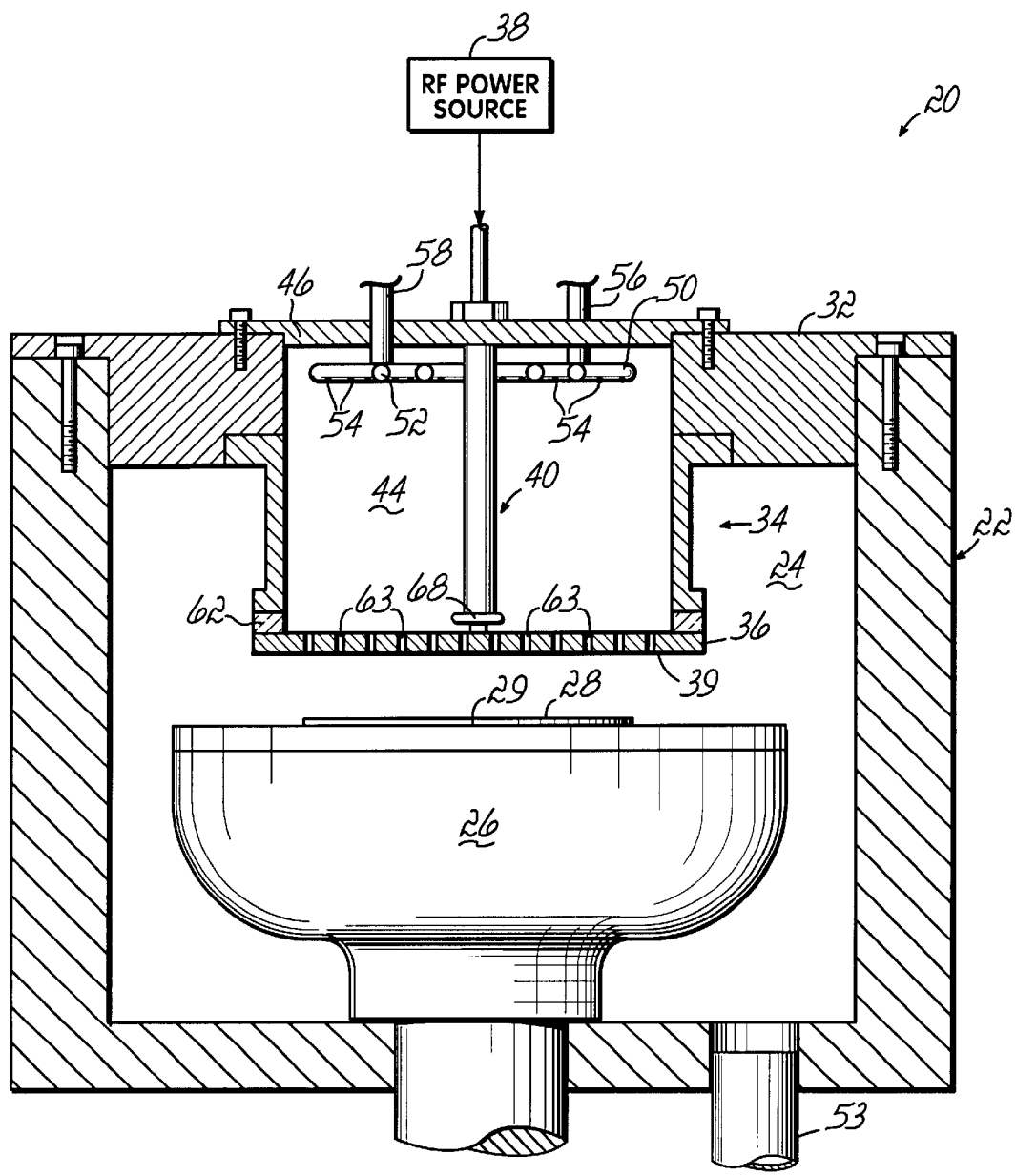
FIG. 2 is a side view, partially in cross-section, of a reactor used to practice the method of the present invention.

Although not limited to any particular apparatus, one apparatus suitable for use in the present invention is a reactor 20 shown in FIG. 2, which is configured to perform plasma-enhanced CVD. It will be appreciated that the CVD methods of the present invention can be performed in various CVD reactors that those skilled in the art would select for the deposition of layers, thin or thick films, on semiconductors substrates, such as hot wall reactors, cold wall reactors, plasma enhanced reactors, and rotating susceptor reactors, with or without premixing of the reactant gases.

Reactor 20 includes a chamber housing 22 which bounds a reaction space 24 and a susceptor 26 in the reaction space 24 for supporting a substrate 28. Susceptor 26 includes a heating element (not shown) that can selectively heat substrate 28 to a temperature between about 200° C. and about 800° C. A gas-dispersing showerhead 36 is suspended in a spaced relationship above substrate 28 such that the bottom surface 39 of showerhead 36 faces the top surface 29 of substrate 28. Showerhead 36 is supported by a cylindrical assembly 34 which extends downwardly from top wall 32 of chamber housing 22. The interior of cylindrical assembly 34 provides a generally vertical flow passage 44 which extends between a housing cover 46 and showerhead 36.

A reducing gas and a vapor-phase reactant are introduced into flow passage 44 by concentric gas rings 50, 52 via supply lines 56, 58. Typically, the flow of process gases in supply lines 56, 58 will be regulated by a flow metering device (not shown) interfaced with a vacuum measurement device (not shown). A spaced array of holes 54 in each ring 50, 52 is configured to evenly disperse the gases within the flow passage 44, where the reducing gas and the vapor-phase reactant mix. The mixture of process gases empties from flow passage 44 through an array of holes 63 positioned and configured to provide a uniform gas flow over the top surface 29 of substrate 28. Processing space 24 is actively evacuated by a vacuum pump (not shown) through port 53 to maintain a mTorr vacuum pressure therein while the mixture of process gases is simultaneously introduced through holes 63.

Showerhead 36 is operably connected to a radio frequency (RF) power source 38 by an RF feedline assembly 40 which extends through cover 46. The RF power source 38 selectively applies a bias power to the showerhead 36, which functions as a powered electrode. An insulator ring 62 formed of an electrically insulating material separates cylinder 34 and showerhead 36 so as to electrically isolate the remainder of reactor 20. Susceptor 26 provides a complementary parallel, electrically-grounded electrode in an opposed relationship to showerhead 36 so that an RF field exists within the portion of reaction space 24 therebetween. The RF power source 38 operates at a frequency of between about 40 kHz and about 16 MHz, typically at an ISM (Industry, Scientific, Medical) standard frequency of about 13.56 MHz, and supplies an electrical power to showerhead 36 of between about 100 Watts and about 1000 Watts, with a typical power level of about 250 Watts.

The RF field imposed between showerhead 36 and susceptor 26 capacitively couples with atoms of the process gas mixture to initiate a plasma in the portion of reaction space 24 between showerhead 36 and substrate 28. Radicals of the vapor-phase reactant combine with the reducing gas in chemical reaction occurring on surface 29 and incrementally deposit a thickness of a solid layer having a composition dependent upon the identity of the gases and other process parameters. Volatile byproducts from the chemical reaction, or waste gases, are evacuated from reaction space 24 through port 53 along with excess reducing gas and excess vapor-phase reactant. It will be appreciated that the plasma in reaction space 24 may be generated by an alternative method, such as inductive coupling of RF energy or electron cyclotron resonance (ECR).

To deposit a layer of a tantalum-based material on substrate 28 by PECVD, a mixture of process gases including a vapor-phase reactant, such as a tantalum halide or more particularly tantalum pentafluoride (TaF$_5$), a hydrogen-containing reducing gas, such as either hydrogen (H$_2$) or ammonia (NH3), and an inert gas of a high-molecular weight, such as argon (Ar) or xenon (Xe), is provided through showerhead 36 to reaction space 24. If depositing a layer of tantalum (Ta), the flow rate of the vapor-phase reactant is about 2 to about 100 standard cubic centimeters per minute (sccm), for example about 20 sccm, with a significant molar excess of the hydrogen-containing gas in the range of about 500 sccm to about 5000 sccm, for example about 2000 sccm. Generally, the flow rate of the hydrogen-containing reducing gas will be a factor of about 5 to about 100 greater than the flow rate of the vapor-phase reactant. The inert gas is introduced with a flow rate of about 50 sccm to about 1000 sccm, for example about 300 sccm. The inlet temperature for the gas mixture is established at about 200° C. to about 500° C., and in one embodiment is about 350° C. The operating vacuum pressure of reaction space 24 is maintained in the range of about 200 mTorr to about 10 Torr, for example about 2 Torr.

The process gases are provided through supply lines 56, 58 and uniformly mix in passage 44. The mixture of process gases exits passage 44 through the array of holes 63 in showerhead 36 and the gas mixture is energized by the RF field of the RF generator 38. An amount of RF power sufficient to generate a plasma in the processing space 24 between the showerhead 36 and substrate 28 is applied to showerhead 36, which is in the range of about 100 Watts to about 1000 Watts, preferably about 250 Watts, at a frequency of preferably about 13.56 MHz. The massive inert gas ions, such as argon ions, assist in initiating and sustaining the plasma. Substrate 28 is heated to a temperature between about 200° C. and about 500° C., for example to a temperature of about 350° C. The activated radicals of vapor-phase reactant, such as a tantalum pentahalide, uniformly flow over the heated substrate 28 and react with the reducing gas, such as hydrogen, to deposit a solid layer of a tantalum-based material, such as tantalum, on surface 29. The deposition rate of the tantalum-based material depends upon process parameters, such as pressure, gas flow rates, temperature, and RF power. For a given set of process parameters, the reaction time controls the layer thickness deposited.

In an embodiment in which ammonia is employed as the reducing gas, a layer of tantalum nitride (TaN$_x$) will be deposited on the surface 29 of substrate 28 under plasma-enhanced CVD deposition conditions similar to those provided above. It will be understood that the stoichiometry of the tantalum nitride can be continuously varied by changing the process parameters, such as the ratio of reducing gas to vapor-phase reactant, and that the parameter x may range from greater than 0 to about 2. It will also be understood that other reducing gases containing both nitrogen and hydrogen may be used to deposit TaN$_x$, for example a mixture of N$_2$ and H$_2$.

Reactor 20 is not limited to depositing only tantalum-based layers on the surface of substrate 28. For example, it will be understood that a layer of silicon may be deposited on substrate 28 by introducing silane (SiH$_4$) and hydrogen through injector rings 50, 52 under a set of process parameters suitable to deposit silicon on substrate 28.

For the fabrication of an interconnect, a layer of a tantalum-based material, such as tantalum or tantalum nitride, is commonly used as a diffusion barrier between a copper conduction layer and a dielectric layer on the surface of a substrate. Exemplary dielectrics familiar in the art of integrated circuit fabrication include oxides such as tantalum oxide, silicon oxides, fluorinated silicon oxides, porous silicon oxides, and carbon-doped silicon oxides; polymers, such as xerogels, aerogels, methyl silsesquioxane (MSQ), and hydrogen silsesquioxane (HSQ); fluorinated amorphous carbon (CFx); barium strontium titanate (BST); and lead zirconium titanate (PZT). As is known, aerogels and xerogels are classes of porous polymers which have a low dielectric constant and CFx is an amorphous carbon containing approximately 4 atomic percent fluorine. Substrate 28 may be any typical substrate used in the fabrication of integrated circuits, including silicon, gallium arsenide, or tetraethylorthosilicate (TEOS), as well as such substrates having patterned areas of metallization, contacts, insulating layers and the like.

Layers of tantalum-based metal deposited by CVD using a vapor-phase reactant of a metal halide, as for example in a plasma-enhanced CVD system such as reactor 20, will usually contain residual halogen atoms as an impurity. For a typical CVD process using tantalum pentafluoride as the vapor-phase reactant, the residual level of fluorine in the tantalum-based layer will be approximately 0.5 atomic percent. Most significantly, a concentration of fluorine as high as 5 atomic percent is trapped at the interface between the dielectric and the metal layer.

The interfacial fluorine concentration may result from trapping of by-product fluorine atoms during the initial growth stages of the layer or from diffusion of residual fluorine in the deposited layer to the interface. During the initial stages of growth of a tantalum layer, solid tantalum is nucleated on the dielectric according to the following chemical reaction:

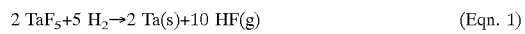

$$2\ TaF_5 + 5\ H_2 \rightarrow 2\ Ta(s) + 10\ HF(g) \quad\quad (Eqn.\ 1)$$

Figure 3:
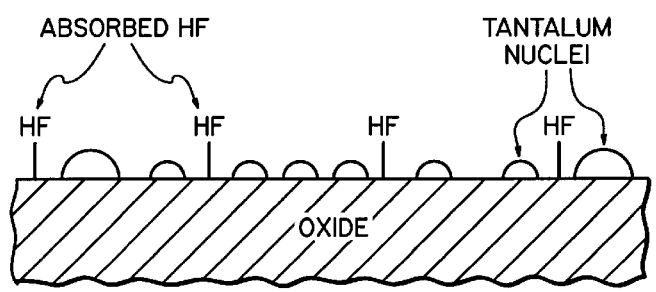
FIG. 3 is a diagrammatic representation of the adsorption of HF on the surface of a dielectric in the initial stages of the CVD of a tantalum-based layer.

At this nucleation stage, most of the substrate surface comprises exposed dielectric and only a small surface area is covered with tantalum nuclei. In one possible mechanism, the gaseous hydrogen fluoride (HF), a by-product of the deposition reaction, can adsorb onto the surface of the dielectric due to its polar nature, as depicted schematically in FIG. 3, and be trapped. The growing tantalum nuclei cover the adsorbed hydrogen fluoride as the layer of tantalum becomes continuous. In the proposed alternative mechanism, residual fluorine trapped in the tantalum-metal layer may diffuse to the metal/dielectric interface and be trapped.

Although these are examples of two possible mechanisms for the trapping of fluorine at the metal/dielectric interface, other mechanisms or a combination of mechanisms may also be possible. The invention is not so limited to the two possible mechanisms described herein. Regardless of the precise mechanism for the fluorine trapping, the enhanced fluorine concentration at the interface correlates with poor bonding of the tantalum-based metal to the dielectric.

Although fluorine trapping is specifically discussed, it is to be understood that other halogens such as bromine (Br) or chlorine (Cl) are subject to trapping at the metal/dielectric interface. In these cases, bromine and chlorine would originate from the reduction of the vapor-phase reactants tantalum pentabromide and tantalum pentachloride, respectively.

In one embodiment of the present invention, adhesion of the tantalum-based layer to the dielectric can be improved if the tantalum-based layer of, for example, tantalum or tantalum nitride, is deposited onto a thin layer of silicon. The intervening layer of silicon is deposited on the surface of the dielectric before depositing the tantalum-based layer. In an embodiment in which a plasma-enhanced CVD reactor substantially similar to reactor 20 is employed, typical deposition conditions for the silicon layer are a substrate temperature of about 200° C. to about 500° C., for example about 350° C.; a silane flow rate of about 20 sccm to about 500 sccm, for example about 100 sccm; a hydrogen flow rate of about 20 sccm to about 500 sccm, for example about 900 sccm; a reactor vacuum pressure of about 200 mTorr to about 10 Torr, for example about 1.5 Torr; and an RF power of about 100 Watts to about 1000 Watts, for example about 250 Watts. However, it will be appreciated that the exact process conditions for depositing the silicon layer are not critical because any set of deposition conditions that yields the proper silicon layer thickness will suffice. The thickness of the deposited silicon layer is between about 1 nm and about 10 nm. It will be apparent to one of ordinary skill in the art that the silicon layer of the present invention can be deposited by a method, such as physical vapor deposition (PVD), other than a CVD process without departing from the spirit and scope of the present invention. However, the silicon cannot be permitted to oxidize during the transfer between processing chambers or while in the CVD reactor awaiting deposition of the layer of tantalum-based metal.

After depositing the silicon layer, a layer of a tantalum-based material, such as tantalum or tantalum nitride, is deposited. In an embodiment in which a plasma-enhanced CVD reactor substantially similar to reactor 20 is employed, typical deposition conditions for a tantalum layer are a substrate temperature of about 200° C. to about 500° C., for example about 350° C.; a tantalum pentafluoride flow rate of about 5 sccm to about 100 sccm, for example about 20 sccm; a hydrogen flow rate of about 500 sccm to about 5000 sccm, for example about 2000 sccm; an argon flow rate of about 50 sccm to about 1000 sccm, for example about 300 sccm; a reactor vacuum pressure of about 200 mTorr to about 10 Torr, for example about 2 Torr; and an RF power of about 100 to about 1000 Watts, for example about 250 Watts. It will be appreciated that, with the exception of using ammonia or other nitrogen-containing gas as the reducing gas, substantially similar deposition conditions are utilized for the deposition of tantalum nitride.

The thickness of the tantalum-based layer should be sufficient to prevent diffusion of copper from the metallization layer into the dielectric during subsequent high temperature processing, and, for example, may be in the range of about 10 nm to about 40 nm. After depositing the tantalum-based layer, the copper interconnect is completed by depositing subsequent layers of dielectric material and copper metallization.

While plasma-enhanced CVD has been specifically discussed, it will be appreciated that the layer of tantalum-based material, such as tantalum or tantalum nitride, may be deposited by an alternative CVD process, such as thermal CVD, without departing from the spirit or scope of the present invention. To prepare a tantalum-based layer by thermal CVD, the metal halide vapor-phase reactant, such as a tantalum pentahalide, and a reducing gas, such as hydrogen or ammonia, are introduced into the reactor and passed over the surface of a substrate heated to a temperature between about 250° C. and about 800° C.

To prevent oxidation of the silicon, the silicon and tantalum-based metal layers may be sequentially deposited over a brief period and within the same reaction chamber. If the thin silicon layer is deposited in a separate chamber, the substrate should be transferred under vacuum, and preferably under a high vacuum level less than $10^{-7}$ Torr, to the reactor equipped to deposit the tantalum-based metal layer. Even under such conditions, the substrate transfer should also be rapid to prevent oxidation of the silicon, which slowly occurs due to low partial pressures of residual oxygen in the vacuum.

In another embodiment of the present invention, the thin silicon layer is a sacrificial layer that is substantially removed during the tantalum-based layer deposition process. Because the deposited layers are in the electrically conducting portion of the circuit and silicon has a much higher electrical resistance than a tantalum-based material, removal of the silicon layer may be desired for minimizing the overall electrical resistance.

Figure 4:
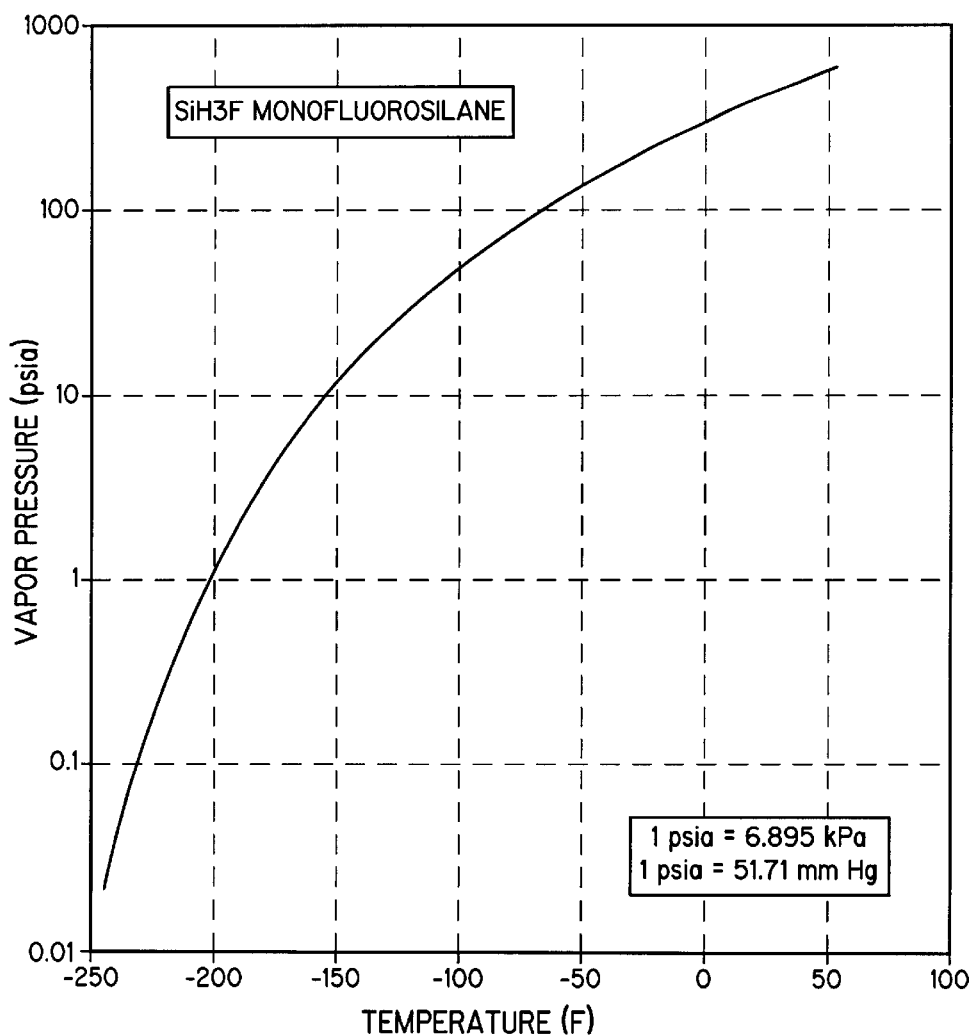
FIG. 4 is a graphical representation showing the vapor pressure of $SiH_3F$ as a function of temperature.

In reference to an embodiment of the present invention for the deposition of tantalum using a tantalum pentafluoride vapor-phase reactant, the mechanisms by which the sacrificial silicon layer is removed and by which the fluorine peak is eliminated are likely related. In a first possible mechanism, the silicon may react with tantalum pentafluoride in the presence of hydrogen to form a volatile by-product such as monofluorosilane ($SiH_3F$). Monofluorosilane has a very high vapor pressure, as shown in FIG. 4. Therefore, monofluorosilane that forms at the surface of the dielectric will vaporize and evolve from the surface to remove the excess fluorine and the silicon. A general equation to describe this proposed mechanism is:

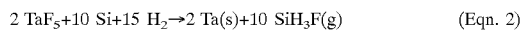

$$2\ TaF_5 + 10\ Si + 15\ H_2 \rightarrow 2\ Ta(s) + 10\ SiH_3F(g) \qquad \text{(Eqn. 2)}$$

A second possible mechanism assumes that the tantalum is deposited by the commonly accepted reaction, as described earlier by Eqn. 1. The hydrogen fluoride by-product adsorbs onto the silicon, in analogy to the absorption of the by-product hydrogen fluoride onto the dielectric. However, in the case of absorption on silicon, the hydrogen fluoride reacts with the silicon according to the following reaction:

$$HF + Si + H_2 \rightarrow 2\ SiH_3F(g) \qquad \text{(Eqn. 3)}$$

Monofluorosilane ($SiH_3F$) readily desorbs from the surface of the silicon due to its high volatility so that the excess fluorine at the interface and silicon from the silicon interlayer are removed simultaneously.

Although these are examples of two possible mechanisms for the release of fluorine that would otherwise be trapped at the metal/dielectric interface and removal of the sacrificial silicon layer, other mechanisms or a combination of mechanisms may also be possible. The invention is not so limited to the two possible mechanisms described herein. The invention is further not so limited to the mechanisms as described with fluorine, but includes other halogens, such as bromine and chlorine.

Some residual silicon from the sacrificial silicon layer may remain at the interface following the deposition of the tantalum-based layer. This residual silicon will likely diffuse into the tantalum-based layer during the remainder of the high temperature CVD process and subsequent processing steps that heat the semiconductor substrate. The presence of silicon as an impurity in either a tantalum metal or tantalum nitride layer is known to improve the performance of the tantalum-based layer as a diffusion barrier.

EXAMPLE 1

Utilizing a reactor similar to reactor 20, a tantalum layer having a nominal thickness of 20 nm was deposited by plasma-enhanced CVD onto a bare silicon substrate which, before the deposition, had the native oxide removed from the surface. The native oxide may be removed, for example, by an in-situ plasma etch in processing space 24. Deposition conditions included a substrate temperature of about 350° C.; a tantalum pentafluoride flow rate of about 20 sccm; a hydrogen flow rate of about 2000 sccm; an Ar flow rate of about 300 sccm; a reactor vacuum pressure of about 2 Torr; and an RF power of about 250 Watts at a frequency of 13.6 MHz.

Figure 1:
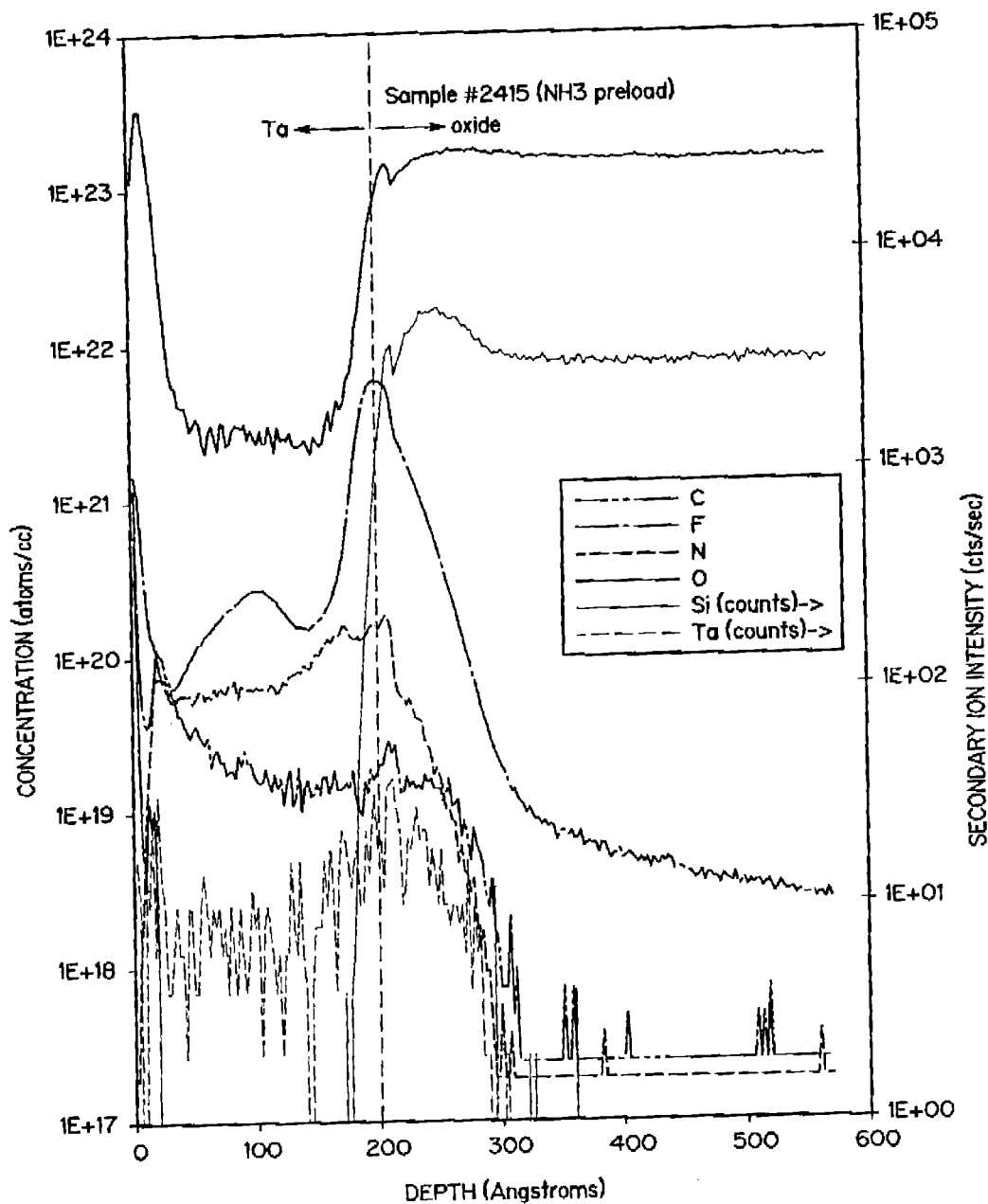
FIG. 1 is a SIMS depth profile of a tantalum layer deposited on a silicon oxide layer formed without providing a thin intervening layer of Si.
Figure 5:
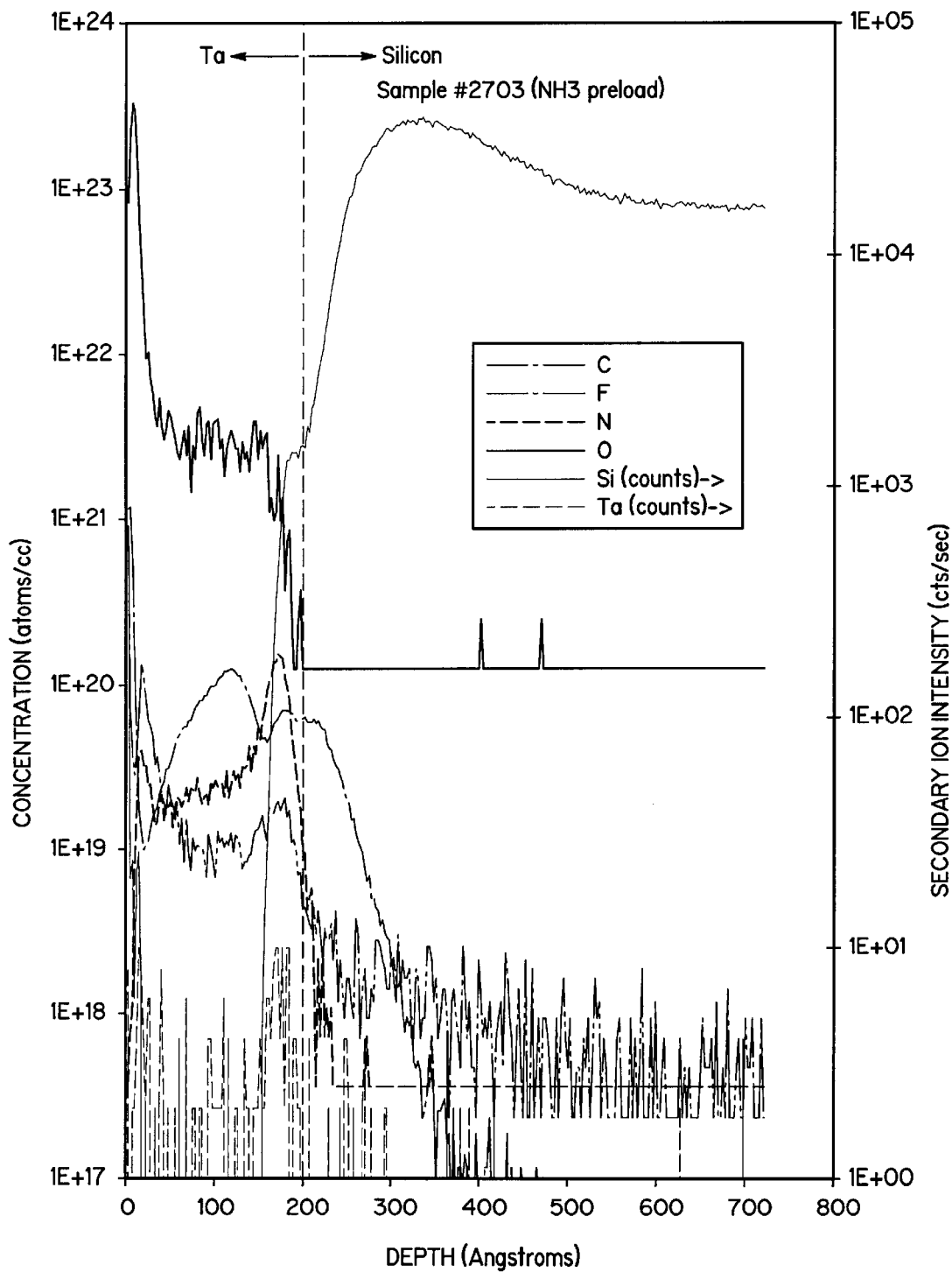
FIG. 5 is a SIMS depth profile of a tantalum thin layer deposited on a silicon oxide layer formed with a thin intervening layer of Si according to an embodiment of the present invention.

FIG. 5 shows a SIMS elemental depth profile for this 20 nm tantalum layer deposited by plasma-enhanced CVD on the silicon substrate. Tantalum deposited directly on bulk silicon is expected to have mechanical and chemical properties similar to tantalum deposited on a thin layer of silicon. At the silicon/tantalum interface, the level of fluorine is not significantly elevated above the concentration in the tantalum layer. The tantalum layer deposited onto silicon was found to have an improved adhesion compared with a comparable tantalum layer deposited onto a surface covered with silicon oxide, wherein the concentration of fluorine is enhanced at the interface (FIG. 1). Therefore, the improvement in adhesion correlates with the reduction in interfacial fluorine.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. For example, a thin layer of silicon may be used during CVD employing a non-tantalum metal halide vapor-phase reactant to prevent halogen atoms from accumulating at the interface between the metal layer and an underlying dielectric. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of depositing a tantalum-based layer with improved adhesion to an underlying dielectric material covered substrate, said method comprising:
   forming a layer of silicon having a thickness onto a dielectric layer on a substrate; and
   depositing a layer of a tantalum-based material by CVD onto the surface of the silicon layer by a chemical reaction of a gas mixture of a tantalum halide vapor-phase reactant and a reducing gas, wherein by-product halogen atoms are created by the chemical reaction; and
   during said depositing, preventing, by means of said layer of silicon, a concentration of the by-product halogen atoms sufficient to affect the adhesion of the tantalum-based material and the dielectric from being incorporated near the interface between the dielectric layer and the layer of tantalum-based material.

2. The method of claim 1, wherein, during the depositing of said layer of tantalum-based material, said layer of silicon is substantially removed from the surface of the dielectric layer.

3. The method of claim 2, wherein silicon atoms from the removed layer of silicon are incorporated as an impurity in the layer of tantalum-based material.

4. The method of claim 1, wherein said layer of silicon has a thickness of between about 1 nm and about 10 nm.

5. The method of claim 1, wherein the tantalum halide is tantalum pentafluoride ($TaF_5$).

6. The method of claim 1, wherein the dielectric material is selected from the group of silicon oxides, fluorinated silicon oxides, porous silicon oxides, and carbon-doped silicon oxides, polymers, fluorinated amorphous carbons, tantalum oxides, barium strontium titanates, lead zirconium titanates, and combinations thereof.

7. The method of claim 1, wherein the depositing of the layer of tantalum-based material by CVD comprises a plasma-enhanced CVD.

8. The method of claim 1, wherein the reducing gas is a hydrogen-containing reducing gas.

9. The method of claim 8, wherein the reducing gas further comprises a nitrogen-containing gas.

10. The method of claim 9, wherein the reducing gas is a mixture of hydrogen ($H_2$) and nitrogen ($N_2$).

11. The method of claim 8, wherein the reducing gas is selected from the group of hydrogen ($H_2$), ammonia ($NH_3$), and combinations thereof.

12. The method of claim 1, wherein the gas mixture further comprises an inert gas.

13. The method of claim 12, wherein the inert gas is is selected from the group of argon (Ar), xenon (Xe), and combinations thereof.

14. The method of claim 1, wherein the substrate is heated to a temperature of between about 200° C. and about 500° C. during the depositing of the tantalum-based material.

15. The method of claim 1, wherein the substrate is heated to a temperature of about 350° C. during the depositing of the tantalum-based material.

16. The method of claim 1, wherein the layer of tantalum-based material is deposited by thermal CVD using said vapor-phase reactant.

17. The method of claim 1, comprising conducting the forming of the silicon layer and the depositing of the tantalum-based layer in a single reaction chamber without removing the substrate from said chamber until each layer has been formed.

18. The method of claim 1, wherein the forming of the layer of silicon comprises a plasma-enhanced CVD.

19. The method of claim 18, wherein the plasma-enhanced CVD comprises:
   creating a plasma from a gas mixture of silane and hydrogen; and
   exposing the surface of the substrate to said plasma under conditions sufficient to deposit said silicon layer.

20. A method of depositing a tantalum-based layer with improved adhesion to an underlying dielectric material covered semiconductor substrate, said method comprising:
   forming a sacrificial layer of silicon having a thickness onto a dielectric layer on a semiconductor substrate; and
   depositing a layer of a tantalum-based material by thermal CVD onto the surface of the silicon layer by a chemical reaction of a gas mixture of a tantalum halide vapor-phase reactant and a reducing gas, during which said sacrificial layer of silicon is substantially removed, and wherein by-product halogen atoms are created by the chemical reaction; and during said depositing, preventing, by means of said sacrificial layer of silicon, a concentration of the by-product halogen atoms sufficient to affect the adhesion of the tantalum based-material and the dielectric from being incorporated near the interface between the dielectric layer and the layer of tantalum-based material.

21. The method of claim 20, wherein said layer of silicon has a thickness of between about 1 nm and about 10 nm.

22. The method of claim 20, wherein the tantalum halide is tantalum pentafluoride ($TaF_5$).

23. The method of claim 20, wherein the dielectric material is selected from the group of silicon oxides, fluorinated silicon oxides, porous silicon oxides, and carbon-doped silicon oxides, polymers, fluorinated amorphous carbons, tantalum oxides, barium strontium titanates, and lead zirconium titanates.

24. The method of claim 20, wherein the reducing gas is a hydrogen-containing reducing gas.

25. The method of claim 24, wherein the reducing gas further comprises a nitrogen-containing gas.

26. The method of claim 25, wherein the reducing gas is a mixture of hydrogen ($H_2$) and nitrogen ($N_2$).

27. The method of claim 24, wherein the reducing gas is selected from the group of hydrogen ($H_2$), ammonia ($NH_3$), and combinations thereof.

28. The method of claim 20, wherein the gas mixture further comprises an inert gas.

29. The method of claim 28, wherein the inert gas is is selected from the group of argon (Ar), xenon (Xe), and combinations thereof.

30. The method of claim 20, comprising conducting the forming of the silicon layer and the depositing of the tantalum-based layer in a single reaction chamber without removing the substrate from said chamber until each layer has been formed.

31. The method of claim 20, wherein the forming of the sacrificial layer of silicon comprises a CVD process.

32. The method of claim 31, wherein the CVD process comprises:

creating a plasma from a gas mixture of silane and hydrogen; and exposing the surface of the substrate to said plasma under conditions sufficient to deposit said sacrificial silicon layer.

33. The method of claim 31, wherein the CVD process comprises:

creating a flow of a gas mixture of silane and hydrogen; and exposing the heated surfaces of the substrate to said flow under conditions sufficient to deposit said sacrificial silicon layer.

34. A method of depositing a tantalum-based layer with unproved adhesion to an underlying dielectric material covered semiconductor substrate, said method comprising:

forming a layer of silicon having a thickness onto a dielectric layer on a semiconductor substrate; and depositing a layer of a tantalum-based material by plasma-enhanced CVD onto the surface of the silicon layer by a chemical reaction of a gas mixture of a tantalum halide vapor-phase reactant, a reducing gas, and an inert gas, wherein by-product halogen atoms are created by the chemical reaction; and during said depositing. preventing. by means of said layer of silicon, a concentration of the by-product halogen atoms sufficient to affect the adhesion of the tantalum based-material and the dielectric from being incorporated near the interface between the dielectric layer and the layer of tantalum-based material.

35. The method of claim 34, wherein, during the depositing of said layer of tantalum-based material, said layer of silicon is substantially removed from the surface of the dielectric layer.

36. The method of claim 35, wherein silicon atoms from the removed layer of silicon are incorporated as an impurity in the layer of tantalum-based material.

37. The method of claim 34, wherein said layer of silicon has a predetermined thickness of between about 1 nm and about 10 nm.

38. The method of claim 34, wherein the tantalum halide is tantalum pentafluoride ($TaF_5$).

39. The method of claim 34, wherein the dielectric material is selected from the group of silicon oxides, fluorinated silicon oxides, porous silicon oxides, and carbon-doped silicon oxides, polymers, fluorinated amorphous carbons, tantalum oxides, barium strontium titanates, and lead zirconium titanates.

40. The method of claim 34, wherein the reducing gas is a hydrogen-containing reducing gas.

41. The method of claim 40, wherein the reducing gas further comprises a nitrogen-containing gas.

42. The method of claim 41, wherein the reducing gas is a mixture of hydrogen ($H_2$) and nitrogen ($N_2$).

43. The method of claim 34, wherein the reducing gas is selected from the group of hydrogen ($H_2$), ammonia ($NH_3$), and combinations thereof.

44. The method of claim 34, wherein the inert gas is is selected from the group of argon (Ar), xenon (Xe), and combinations thereof.

45. The method of claim 34, wherein the substrate is heated to a temperature of between about 200° C. and about 500° C. during the depositing of the tantalum-based material.

46. The method of claim 34, wherein the substrata is heated to a temperature of about 350° C. during the depositing of the tantalum-based material.

47. The method of claim 34, comprising conducting the forming of the silicon layer and the depositing of the tantalum-based layer in a single reaction chamber without removing the substrate from said chamber until each layer has been formed.

48. The method of claim 34, wherein the forming of the layer of silicon comprises a CVD process.

49. The method of claim 48, wherein the CVD process comprises:

creating a plasma from a gas mixture of silane and hydrogen; and exposing the surface of the substrate to said plasma under conditions sufficient to deposit said silicon layer.

50. The method of claim 48, wherein the CVD process comprises:

creating a flow of a gas mixture of silane and hydrogen; and exposing the heated surfaces of the substrate to said flow under conditions sufficient to deposit said silicon layer.

51. A method of forming copper-based interconnects on a tantalum-based diffusion barrier layer with improved adhesion to an underlying dielectric material covered substrate, said method comprising:

forming a layer of silicon having a thickness onto a dielectric layer on a substrate;

depositing a diffusion barrier layer of a tantalum-based material selected from the group consisting of Ta and $TaN_2$ by CVD onto the surface of the silicon layer by a chemical reaction of a gas mixture of a tantalum halide vapor-phase reactant and a reducing gas, wherein by-product halogen atoms are created by the chemical reaction; and during said depositing, preventing, by means of said layer of silicon, a concentration of the by-product halogen atoms sufficient to affect the adhesion of the tantalum-based material and the dielectric from being incorporated near the interface between the dielectric layer and the diffusion barrier layer of tantalum-based material; and depositing a copper-based layer onto the diffusion barrier layer to form said copper-based interconnects.

52. The method of claim 51, wherein, during the depositing of said diffusion barrier layer of tantalum-based material, said layer of silicon is substantially removed from the surface of the dielectric layer.

53. The method of claim 52, wherein silicon atoms from the removed layer of silicon are incorporated as an impurity in the diffusion barrier layer of tantalum-based material.

54. The method of claim 51, wherein said layer of silicon has a predetermined thickness of between about 1 nm and about 10 nm.

55. The method of claim 51, wherein the tantalum halide is tantalum pentafluoride ($TaF_5$).

56. The method of claim 51, wherein the dielectric material is selected from the group of silicon oxides, fluorinated silicon oxides, porous silicon oxides, and carbon-doped silicon oxides, polymers, fluorinated amorphous carbons, tantalum oxides, barium strontium titanates, lead zirconium titanates, and combinations thereof.

57. The method of claim 51, wherein the depositing of the diffusion barrier layer of tantalum-based material by CVD comprises a plasma-enhanced CVD.

58. The method of claim 51, wherein the reducing gas is a hydrogen-containing reducing gas.

59. The method of claim 58, wherein the reducing gas further comprises a nitrogen-containing gas.

60. The method of claim 59, wherein the reducing gas is a mixture of hydrogen ($H_2$) and nitrogen ($N_2$).

61. The method of claim 58, wherein the reducing gas is selected from the group of hydrogen ($H_2$), ammonia ($NH_3$), and combinations thereof.

62. The method of claim 51, wherein the gas mixture further comprises an inert gas.

63. The method of claim 62, wherein the inert gas is is selected from the group of argon (Ar), xenon (Xe), and combinations thereof.

64. The method of claim 51, wherein the substrate is heated to a temperature of between about 200° C. and about 500° C. during the depositing of the tantalum-based material.

65. The method of claim 51, wherein the substrate is heated to a temperature of about 350° C. during the depositing of the tantalum-based material.

66. The method of claim 51, wherein the diffusion barrier layer of tantalum-based material is deposited by thermal CVD using said vapor-phase reactant.

67. The method of claim 51, comprising conducting the forming of the silicon layer and the depositing of the tantalum-based layer in a single reaction chamber without removing the substrate from said chamber until each layer has been formed.

68. The method of claim 51, wherein the forming of the layer of silicon comprises a plasma-enhanced CVD.

69. The method of claim 68, wherein the plasma-enhanced CVD comprises:

creating a plasma from a gas mixture of silane and hydrogen; and exposing the surface of the substrate to said plasma under conditions sufficient to deposit said silicon layer.

70. A method of forming copper-based interconnects on a tantalum-based diffusion barrier layer with improved adhesion to an underlying dielectric material covered semiconductor substrate, said method comprising:

forming a layer of silicon having a thickness onto a dielectric layer on a semiconductor substrate;

depositing a diffusion barrier layer of a tantalum-based material selected from the group consisting of Ta and $TaN_K$ by plasma-enhanced CVD onto the surface of the silicon layer by a chemical reaction of a gas mixture of a tantalum halide vapor-phase reactant, a reducing gas, and an inert gas, wherein by-product halogen atoms are created by the chemical reaction; and during said depositing, preventing, by means of said layer of silicon, a concentration of the by-product halogen atoms sufficient to affect the adhesion of the tantalum-based material and the dielectric from being incorporated near the interface between the dielectric layer and the diffusion barrier layer of tantalum-based material; and depositing a copper-based layer onto the diffusion barrier layer to form said copper-based interconnects.

71. The method of claim 70, wherein, during the depositing of said layer of tantalum-based material, said layer of silicon is substantially removed from the surface of the dielectric layer.

72. The method of claim 71, wherein silicon atoms from the removed layer of silicon are incorporated as an impurity in the layer of tantalum-based material.

73. The method of claim 70, wherein said layer of silicon has a thickness of between about 1 nm and about 10 nm.

74. The method of claim 70, wherein the tantalum halide is tantalum pentafluoride ($TaF_5$).

75. The method of claim 70, wherein the dielectric material is selected from the group of silicon oxides, fluorinated silicon oxides, porous silicon oxides, and carbon-doped silicon oxides, polymers, fluorinated amorphous carbons, tantalum oxides, barium strontium titanates, and lead zirconium titanates.

76. The method of claim 70, wherein the reducing gas is a hydrogen-containing reducing gas.

77. The method of claim 76, wherein the reducing gas further comprises a nitrogen-containing gas.

78. The method of claim 77, wherein the reducing gas is a mixture of hydrogen ($H_2$) and nitrogen ($N_2$).

79. The method of claim 70, wherein the reducing gas is selected from the group of hydrogen ($H_2$), ammonia ($NH_3$), and combinations thereof.

80. The method of claim 70, wherein the inert gas is is selected from the group of argon (Ar), xenon (Xe), and combinations thereof.

81. The method of claim 70, wherein the substrate is heated to a temperature of between about 200° C. and about 500° C. during the depositing of the tantalum-based material.

82. The method of claim 70, wherein the substrate is heated to a temperature of about 350° C. during the depositing of the tantalum-based material.

83. The method of claim 70, comprising conducting the forming of the silicon layer and the depositing of the tantalum-based layer in a single reaction chamber without removing the substrate from said chamber until each layer has been formed.

84. The method of claim 70, wherein the forming of the layer of silicon comprises a CVD process.

85. The method of claim 84, wherein the CVD process comprises:
   creating a plasma from a gas mixture of silane and hydrogen; and
   exposing the surface of the substrate to said plasma under conditions sufficient to deposit said silicon layer.

86. The method of claim 84, wherein the CVD process comprises:
   creating a flow of a gas mixture of silane and hydrogen; and
   exposing the heated surfaces of the substrate to said flow under conditions sufficient to deposit said silicon layer.

* * * * *

UNITED STATES PATENT AND TRADEMARK OFFICE
CERTIFICATE OF CORRECTION

PATENT NO. : 6,632,737 B1
DATED : October 14, 2003
INVENTOR(S) : Hillman et al.

It is certified that error appears in the above-identified patent and that said Letters Patent is hereby corrected as shown below:

Column 2,
Line 36, reads "(NH3)." and should read -- ($NH_3$). --.

Column 4,
Line 13, reads "on semiconductors" and should read -- on semiconductor --.

Column 5,
Line 5, reads "byproducts" and should read -- by-products --.
Line 17, reads "(NH3), and" and should read -- ($NH_3$), and --.
Line 26, reads "5 to about 100 greater" and should read -- 5 to about 100 times greater --.

Column 8,
Lines 44-46 read "in analogy to the absorption of the by-product hydrogen fluoride onto the dielectric. However, in the case of adsorption" and should read -- in analogy to the adsorption of the by-product hydrogen fluoride onto the dielectric. However, in the case of adsorption --.

Column 9,
Line 48, reads "applicant's general" and should read -- applicants' general --.

Column 10,
Line 32, reads "the inert gas is is" and should read -- the inert gas is --.

Column 11,
Line 6, reads "tantalum based-material" and should read -- tantalum-based material --.
Line 30, reads "the inert gas is is" and should read -- the inert gas is --.
Line 55, reads "unproved" and should read -- improved --.
Line 66, reads "during said depositing. preventing. by means of" and should read -- during said depositing, preventing, by means of --.

Column 12,
Lines 1-2, reads "tantalum based-material" and should read -- tantalum-based material --.
Line 13, reads "has a predetermined thickness" and should read -- has a thickness --.
Line 32, reads "the inert gas is is" and should read -- the inert gas is --.
Line 39, reads "substrata" and should read -- substrate --.

UNITED STATES PATENT AND TRADEMARK OFFICE
CERTIFICATE OF CORRECTION

PATENT NO.    : 6,632,737 B1
DATED         : October 14, 2003
INVENTOR(S)   : Hillman et al.

It is certified that error appears in the above-identified patent and that said Letters Patent is hereby corrected as shown below:

Column 13,
Line 3, reads "$TaN_2$" and should read -- $TaN_x$ --.
Line 24, reads "has a predetermined thickness" and should read -- has a thickness --.
Line 48, reads "the inert gas is is" and should read -- the inert gas is --.

Column 14,
Line 16, reads "$TaN_k$" and should read -- $TaN_x$ --.
Line 19, reads "atoms arc" and should read -- atoms are --.
Line 56, reads "the inert gas is is" and should read -- the inert gas is --.

Signed and Sealed this

Twenty-ninth Day of June, 2004

JON W. DUDAS
*Acting Director of the United States Patent and Trademark Office*